United States Patent
Choi et al.

(10) Patent No.: US 7,933,369 B2
(45) Date of Patent: Apr. 26, 2011

(54) APPARATUS FOR AUTOMATIC GAIN CONTROL AND WIRELESS RECEIVER EMPLOYING THE SAME

(75) Inventors: Jang Hong Choi, Daejeon (KR); Seong Do Kim, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1044 days.

(21) Appl. No.: 11/635,197

(22) Filed: Dec. 7, 2006

(65) Prior Publication Data

US 2007/0076828 A1      Apr. 5, 2007

(30) Foreign Application Priority Data

Dec. 8, 2005   (KR) .................. 10-2005-0119395
Oct. 11, 2006  (KR) .................. 10-2006-0098890

(51) Int. Cl.
*H04L 27/08* (2006.01)
(52) U.S. Cl. ........................ 375/345; 455/136
(58) Field of Classification Search .......... 375/345, 375/316, 279; 330/10, 129, 141, 279; 455/136
See application file for complete search history.

(56) References Cited

U.S. PATENT DOCUMENTS

| | | | | |
|---|---|---|---|---|
| 4,450,445 A | * | 5/1984 | Conner et al. | 342/84 |
| 5,422,601 A | * | 6/1995 | Kovacs et al. | 330/279 |
| 5,469,115 A | * | 11/1995 | Peterzell et al. | 330/129 |
| 5,590,203 A | * | 12/1996 | Matsui | 381/4 |
| 5,636,252 A | * | 6/1997 | Patel et al. | 375/345 |
| 7,385,444 B2 | * | 6/2008 | Kurokawa | 330/10 |
| 2002/0113654 A1 | * | 8/2002 | Hart | 330/279 |
| 2004/0152432 A1 | * | 8/2004 | Gu | 455/136 |

FOREIGN PATENT DOCUMENTS

| | | |
|---|---|---|
| JP | 08-078982 | 3/1996 |
| JP | 2004-194355 | 7/2004 |
| KR | 10-0432598 | 5/2004 |
| KR | 10-0467883 | 1/2005 |

OTHER PUBLICATIONS

Palaskas, Y., et al., "A Power Efficient Channel Selection Filter / Coarse AGC with No Range Switching Transients." 2003. *IEEE 2003 Custom Integrated Circuits Conference* (0-7803-7842-3/03), pp. 21-24.

* cited by examiner

*Primary Examiner* — David C. Payne
*Assistant Examiner* — Leon-Viet Q Nguyen
(74) *Attorney, Agent, or Firm* — Ladas & Parry LLP

(57) ABSTRACT

Provided is an apparatus for automatic gain control (AGC) widely used in a receiver of a wireless communication system. The receiver of a wireless communication system includes: a step variable gain amplifier and an analog variable gain amplifier disposed in the path of a wireless signal and amplifying the wireless signal; an analog gain control unit for generating a gain control voltage for feedback-controlling an amplification value of the analog variable gain amplifier; a digital gain control unit for receiving the control voltage and generating a digital code determining an amplification value of the step variable gain amplifier. The apparatus for AGC constituted as described above can reduce power consumption and the number of devices by efficiently running an AGC loop in an analog domain, and can be embodied at low cost in a structure appropriately controlling the step gain amplifier and the analog gain amplifier.

6 Claims, 3 Drawing Sheets

APPARATUS FOR AUTOMATIC GAIN CONTROL AND WIRELESS RECEIVER EMPLOYING THE SAME

CROSS-REFERENCE TO RELATED APPLICATION

This application claims priority to and the benefit of Korean Patent Application Nos. 2005-119395, filed Dec. 8, 2005 and 2006-98890, filed Oct. 11, 2006, the disclosure of which is incorporated herein by reference in its entirety.

BACKGROUND

1. Field of the Invention

The present invention relates to an apparatus for automatic gain control (AGC) in a receiver of a wireless communication system.

2. Discussion of Related Art

In general, the output power of a transmission unit in a wireless communication system is uniform, but the amount of signal gain varies according to movement of a receiver, distance of the receiver, and channel environment.

However, in order to ensure a sufficient dynamic range of an analog-digital (AD) converter, inputs of the AD converter must have a uniform level. Therefore, the gain of a receiver must vary to compensate for change in distance or channel environment.

Such an operation is performed by an apparatus for AGC. The AGC apparatus compares the power of an input signal with a reference power and determines the gain of the input signal. Here, the gains of a radio frequency (RF) amplifier and an intermediate frequency (IF) amplifier are controlled according to the determined gain, to amplify the signal to a desired level.

As illustrated in FIG. 1, most AGC apparatuses that are currently used adjust the gains of an RF amplifier 100 and IF amplifier 103 using gain control signals generated by a digital AGC 105 of a digital demodulation unit 104. The digital demodulation unit 104 also includes an analog/digital (ND) converter 106.

In FIG. 1, a modulated RF signal is input to a receiver through an antenna, and the RF amplifier 100 receives a gain control signal and amplifies the input signal. Since the amplified RF signal is generally a high-frequency signal, a large amount of power is needed to process it and filtering is difficult. Thus, the amplified RF signal is down-converted into an IF signal by a mixer 101 of FIG. 1 and then passed through a band-pass filter 102 to remove a part of the signal outside a channel. In order to supplement insufficient gain of the RF amplifier 100, the IF amplifier 103 amplifies the IF signal. Here, the IF amplifier 103 receives an AGC signal of the digital demodulation unit 104 and adjusts gain.

When the AGC signal is received to adjust gain in a digital domain, linearity of the gains of the RF amplifier 100 and the IF amplifier 103 must be ensured. When the linearity of the gains of the amplifiers is not ensured, the stability of the AGC loop deteriorates.

In addition, in order to control gain in a digital domain, characteristics of devices in an analog domain must be considered, and so design becomes more difficult. More specifically, an AGC loop gets longer, and consequently the number of design parameters to be considered increases.

A conventional AGC loop of an analog domain is set up such that an RF AGC loop and an IF AGC loop operate separately so as to ensure stability. However, the RF amplifier 100 is generally designed to have a step gain in consideration of linearity and a noise characteristic. Therefore, it is hard to use an AGC loop, and thus the gain of the RF amplifier 100 is controlled by applying a received-signal-strength-indicator (RSSI). In this case, however, an RSSI block must process high-frequency signals, thus consuming a large amount of power.

SUMMARY OF THE INVENTION

The present invention is directed to an apparatus for automatic gain control (AGC) and a wireless receiver equipped with the same, the apparatus being capable of reducing power consumption and the number of devices by efficiently running an AGC loop in an analog domain.

The present invention is also directed to an apparatus for AGC that can be embodied in a structure appropriately controlling a step gain amplifier and an analog gain amplifier at low cost.

One aspect of the present invention provides an apparatus for AGC comprising: an analog gain control unit for generating a gain control voltage for feedback-controlling an amplification value of an external amplification means in a high-precision range by an analog method; and a digital gain control unit for receiving the gain control voltage and generating a digital code determining the amplification value of the external amplification means in a low-precision range.

Another aspect of the present invention provides a wireless receiver comprising: a step variable gain amplifier and an analog variable gain amplifier disposed in a path of a wireless signal and amplifying the wireless signal; an analog gain control unit for generating a gain control voltage for feedback-controlling an amplification value of the analog variable gain amplifier; a digital gain control unit for receiving the control voltage and generating a digital code determining an amplification value of the step variable gain amplifier.

The wireless receiver of the present invention uses the step variable gain amplifier that requires low cost and precisely controls gain, and the analog variable gain amplifier capable of continuous gain control, thereby achieving efficient gain control in comparison with cost.

To this end, the apparatus for AGC performs gain control for the external amplification means (the step variable gain amplifier and the analog variable gain amplifier in the present invention) separately in a low-precision range and a high-precision range of a large adjusting unit. For gain control in the low-precision range, the digital code for step gain amplification control is output, and the analog gain control voltage for an output signal of the external amplification means is output according to a feedback method. Here, the digital code is determined in consideration of continuous states of the gain control voltage. For example, when the gain control voltage is continuously given to rapidly increase gain, it is possible to rapidly amplify gain by amplifying the step gain in the low-precision range.

The step variable gain amplifier may be used to amplify a high-frequency signal received at an antenna, and the analog variable gain amplifier may amplify or attenuate an input signal, so that inputs of an analog-digital (AD) converter have a uniform level.

An analog AGC for adjusting the gain of the analog variable gain amplifier may be included, and gain control of the step variable gain amplifier may be performed by converting the control voltage of the analog gain control unit into a predetermined digital code for gain control.

BRIEF DESCRIPTION OF THE DRAWINGS

The above and other objects, features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described to make this disclosure complete and enabling of practice of the invention by those of ordinary skill in the art.

Figure 1:
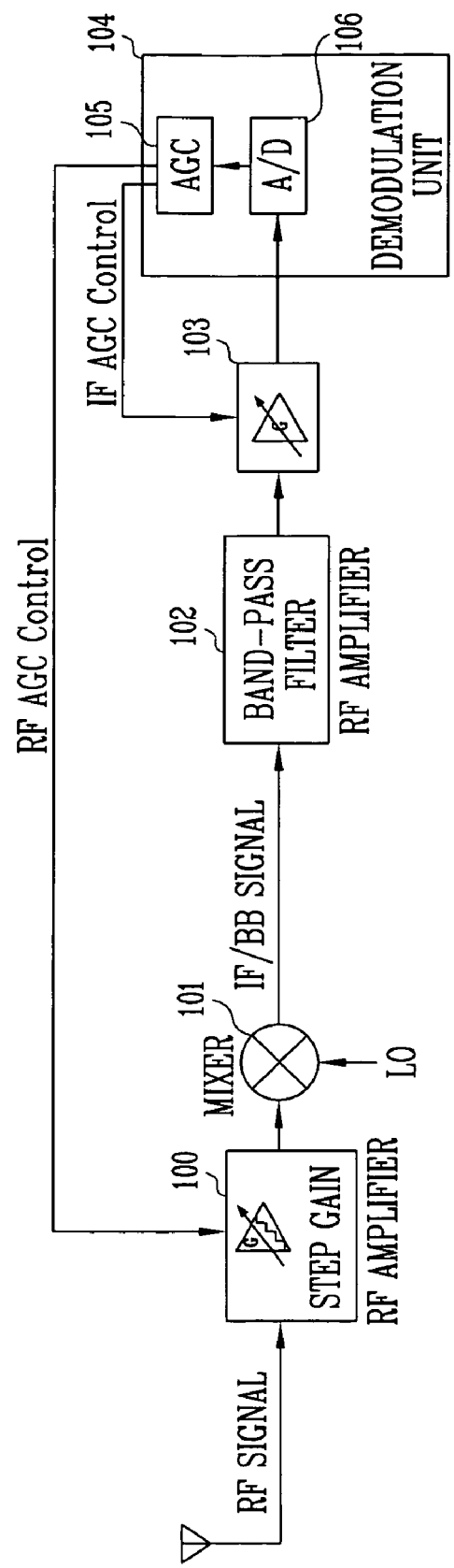
FIG. 1 is a block diagram of a receiver of a wireless communication system including an apparatus for automatic gain control (AGC) according to conventional art.
Figure 2:
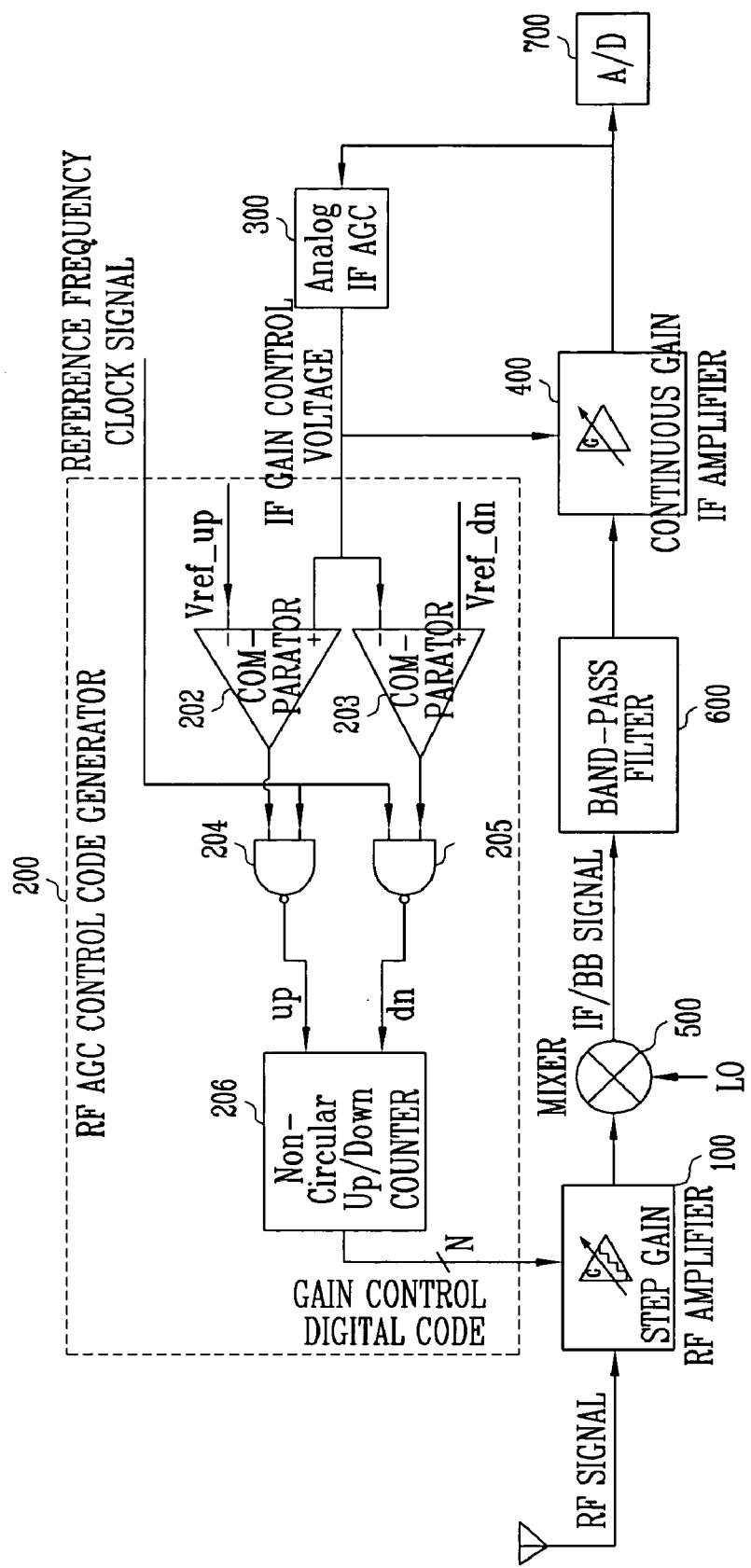
FIG. 2 is a block diagram of a receiver of a wireless communication system employing an apparatus for AGC according to an exemplary embodiment of the present invention.

Referring to FIG. 2, a wireless receiver equipped with an apparatus for automatic gain control (AGC) according to an exemplary embodiment of the present invention comprises: a radio frequency (RF) amplifier 100, an intermediate frequency (IF) amplifier 400, an analog gain control unit 300 (Analog IF AGC), a digital gain control unit 200, a mixer 500, and a band-pass filter 600. The RF amplifier 100 is a step variable gain amplifier for receiving and amplifying an RF signal received at an external antenna. The IF amplifier 400 is an analog variable gain amplifier for amplifying a signal to a predetermined level and outputting it to an external analog/digital (A/D) converter 700. The analog gain control unit 300 generates a gain control voltage for feedback-controlling the gain of the analog variable gain amplifier 400 so as to maintain a uniform level of input to the A/D converter 700. The digital gain control unit 200 receives the gain control voltage and generates a digital code determining the amplification value of the step variable gain amplifier 100. The mixer 500 is for down-converting the output signal of the step variable gain amplifier 100 into a predetermined IF signal. The band-pass filter 600 is for filtering the signal down-converted by the mixer 500 and transferring it to the IF amplifier 400.

FIG. 2 illustrates a constitution of a receiver of a wireless communication system comprising the apparatus for AGC, the antenna, and the A/D converter 700 according to this exemplary embodiment. In the illustrated structure, it can be seen that the antenna, the RF amplifier 100, the mixer 500, the band-pass filter 600, the IF amplifier 400 and the A/D converter 700 constitute a main signal path. The illustrated structure includes the analog gain control unit 300 that feedback-controls the IF amplifier 400 using the output signal of the IF amplifier 400. The analog gain control unit 300 generates a gain control voltage for controlling the gain of the IF amplifier 400. Therefore, it is preferable for the IF amplifier 400 to be controlled according to voltage. In addition, in this exemplary embodiment, the gain control voltage is applied to the digital gain control unit 200, and the digital gain control unit 200 changes the digital code for gain control of the RF amplifier 100 according to the gain control voltage.

As illustrated in FIG. 2, the digital gain control unit 200 may comprise a non-circular up/down counter 206, voltage comparators 202 and 203, and NAND gates 204 and 205. The non-circular up/down counter 206 is for controlling the step gain of the RF amplifier 100. The voltage comparators 202 and 203 receive the IF gain control voltage, which is the control signal of the analog gain control unit 300, and compare it with reference voltages Vref_up and Vref_dn so as to determine the polarity of the non-circular up/down counter 206. The NAND gates 204 and 205 are for outputting the outputs of the comparators 202 and 203 in a pulse form tuned to a reference frequency clock signal.

Operation of the digital gain control unit 200 will be described below.

When the level of an RF input signal is high, the IF gain control voltage output from the analog gain control unit 300 is reduced. When the gain control voltage becomes lower than the reference voltage Vref_dn, the polarity of the up/down counter 206 becomes negative, thus reducing the digital control gain code for the RF amplifier 100. Here, the code reduction rate is the same as the period of the reference frequency clock signal. On the other hand, when the level of an RF input signal is low, the IF gain control voltage output from the analog gain control unit 300 increases. When the gain control voltage becomes higher than the reference voltage Vref_up, the polarity of the up/down counter 206 becomes positive, thus increasing the digital control gain code for the RF amplifier 100. Meanwhile, when the gain control voltage is higher than the reference voltage Vref_dn and lower than the reference voltage Vref_up, the up/down counter 206 maintains a previous counting value as is.

When the output value of the up/down counter 206 reaches its maximum, a pulse continuously increasing the gain control code may be generated. In this case, the up/down counter 206 may be implemented to continuously output its maximum output value, and the analog gain control unit 300 may be implemented to continuously increase its gain control voltage. On the other hand, when the output value of the up/down counter 206 reaches its minimum, a pulse continuously reducing the gain control code may be generated due to the characteristics of the non-circular counter. In this case, the output value of the up/down counter 206 is kept at the minimum, and the gain control voltage of the analog gain control unit 300 is continuously reduced. The reason for this is that the IF amplifier 400, which is closer to the output end than the RF amplifier 100, is preferable for high-precision gain control.

Figure 3:
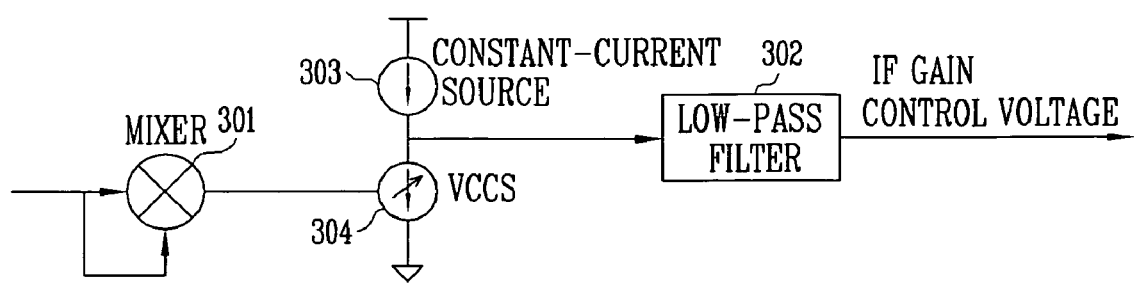
FIG. 3 illustrates a detailed constitution of an analog gain control unit of FIG. 2.

As illustrated in FIG. 3, the analog gain control unit 300 comprises a mixer 301, a low-pass filter 302, and a reference level applier. The mixer 301 is for squaring the output signal of the analog gain amplifier 400. The low-pass filter 302 is for removing harmonics from the output signal of the mixer 301 and converting the output signal into a gain control voltage. The reference level applier is for applying a reference level to the output signal of the low-pass filter 302.

The mixer 301 serves to square an IF signal so as to extract the level of the IF signal. The reference level applier can be implemented by a constant-current source 303 determining an output level for keeping the output level of the analog IF amplifier 400 uniform, and a voltage-control current source 304 for comparing the outputs of the constant-current source 303 and the mixer 301 with each other in the form of currents. The low-pass filter 302 converts a difference in current between the constant-current source 303 and the voltage-control current source 304 into voltage and removes harmonic components. The output of the low-pass filter 302 is the IF gain control voltage.

Figure 4:
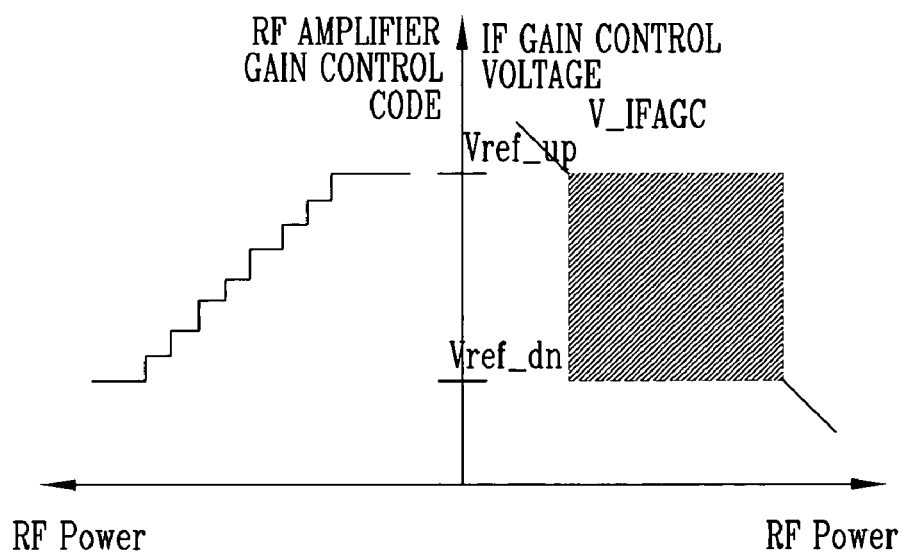
FIG. 4 is a graph showing gain control signals of an intermediate frequency (IF) amplifier and a radio frequency (RF) amplifier versus power of an RF input signal in a receiver of a wireless communication system according to an exemplary embodiment of the present invention.

FIG. 4 is a graph showing a digital gain control code and an IF gain control voltage of an RF amplifier of a receiver of a wireless communication system constituted according to the present exemplary embodiment, versus applied RF power. When the digital gain control code of the RF amplifier is between the maximum and the minimum in the graph, the IF gain control voltage converges to an arbitrary point in the box. However, when the digital gain control code of the RF amplifier does not converge between the maximum and the minimum, the IF gain control voltage converges to a gain curve outside the box.

The above-described apparatus for AGC and receiver of a wireless communication system employing the apparatus according to the present invention have the following advantages:

First, even though a digital code for gain control of a step variable gain amplifier is not directly input, the gain of the step variable gain amplifier can be controlled using a simple structure in an analog domain.

Second, a block, such as a received-signal-strength-indicator (RSSI) block, for detecting the power of an RF signal, is not needed, thus reducing power consumption.

Third, since a step variable gain amplifier and an analog variable gain amplifier are separately controlled in an analog domain, dependence on a digital block can be minimized. In addition, the receiver and the apparatus can be easily integrated in a chip due to their simple structure.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An apparatus for automatic gain control, comprising:
an analog gain control unit for generating a gain control voltage for feedback-controlling an amplification value of an external amplification means in a high-precision range by an analog method; and
a digital gain control unit for receiving the gain control voltage from the analog gain control unit and generating a digital code determining an amplification value of the external amplification means in a low-precision range by comparing the gain control voltage with an upper level reference voltage and a lower level reference voltage,
wherein the analog gain control unit comprises:
a mixer for squaring an output signal of the external amplification means;
a low-pass filter for removing harmonics from the output signal of the mixer and converting the output signal into the gain control voltage and
a reference level applier for applying a reference level to an output signal of the low-pass filter, and wherein the reference level applier comprises:
a constant-current source for determining an output level for keeping an output level of the external amplification means uniform at an output level; and
a voltage-control current source for generating current according to an output level of the mixer,
wherein a difference in current between the constant-current source and the voltage-control current source is applied to the low-pass filter.

2. The apparatus of claim 1, wherein the digital gain control unit comprises:
a non-circular up/down counter for generating the digital code; and
a voltage comparator for comparing the gain control voltage with a reference voltage and determining a polarity of the non-circular up/down counter.

3. A wireless receiver, comprising:
a step variable gain amplifier and an analog variable gain amplifier disposed in a path of a wireless signal and amplifying the wireless signal;
an analog gain control unit for generating a gain control voltage for feedback-controlling an amplification value of the analog variable gain amplifier;
a digital gain control unit for receiving the gain control voltage from the analog gain control unit and generating a digital code determining an amplification value of the step variable gain amplifier by comparing the gain control voltage with an upper level reference voltage and a lower level reference voltage; and
wherein the analog gain control unit comprises:
a mixer for squaring an output signal of the analog variable gain amplifier;
a low-pass filter for removing harmonics from an output signal of the mixer and converting the output signal into the gain control voltage; and
a reference level applier for applying a reference level to the output signal of the low-pass filter,
wherein the reference level applier comprises:
a constant-current source for determining an output level for keeping the output level of the analog variable gain amplifier uniform; and
a voltage-control current source for generating current according to an output level of the mixer,
wherein a difference in current between the constant-current source and the voltage-control current source is applied to the low-pass filter.

4. The wireless receiver of claim 3, wherein the step variable gain amplifier receives a radio frequency (RE) signal from an external antenna, and the analog variable gain amplifier outputs an amplified signal to an external analog-digital (AD) converter.

5. The wireless receiver of claim 3, further comprising:
a mixer for down-converting an output signal of the step variable gain amplifier into a predetermined intermediate frequency (IF) signal; and
a band-pass filter for filtering the signal down-converted by the mixer and transferring it to the analog variable gain amplifier.

6. The wireless receiver of one of claims 3 to 5, wherein the digital gain control unit comprises:
a non-circular up/down counter for generating the digital code; and
a voltage comparator for comparing the gain control voltage with a reference voltage and determining a polarity of the non-circular up/down counter.

* * * * *